(12) United States Patent
Osada et al.

(10) Patent No.: US 7,710,764 B2
(45) Date of Patent: May 4, 2010

(54) SEMICONDUCTOR MEMORY CELLS WITH SHARED P-TYPE WELL

(75) Inventors: Kenichi Osada, Kawasaki (JP);
Koichiro Ishibashi, Warabi (JP);
Yoshikazu Saitou, Hamura (JP);
Masashige Harada, Kodaira (JP);
Takehiko Kijima, Fussa (JP)

(73) Assignees: Renesas Technology Corp., Tokyo (JP);
Hitachi ULSI Systems Co., Ltd., Tokyo (JP)

( * ) Notice: Subject to any disclaimer, the term of this patent is extended or adjusted under 35 U.S.C. 154(b) by 303 days.

(21) Appl. No.: 11/783,123

(22) Filed: Apr. 6, 2007

(65) Prior Publication Data
US 2007/0286001 A1    Dec. 13, 2007

Related U.S. Application Data

(63) Continuation of application No. 10/170,583, filed on Jun. 14, 2002, now Pat. No. 7,219,272.

(30) Foreign Application Priority Data

Jul. 4, 2001 (JP) ............................. 2001-202919
Jan. 25, 2002 (JP) ............................. 2002-016320

(51) Int. Cl.
*G11C 11/00* (2006.01)

(52) U.S. Cl. ......................... 365/156; 365/154; 365/200

(58) Field of Classification Search ................ 365/154, 365/156, 200, 230.04; 257/E27.098, 903
See application file for complete search history.

(56) References Cited

U.S. PATENT DOCUMENTS 4,791,606 A * 12/1988 Threewitt et al. .......... 365/49.1
4,817,052 A    3/1989 Shinoda et al.

(Continued)

FOREIGN PATENT DOCUMENTS

JP     58-139399     2/1982

(Continued)

OTHER PUBLICATIONS

Office Action (Decision of Refusal) from Japanese Patent Office dated May 27, 2009, with full English translation.

*Primary Examiner*—Tuan T Nguyen
*Assistant Examiner*—R Lance Reidlinger
(74) *Attorney, Agent, or Firm*—Stites & Harbison PLLC; Juan Carlos A. Marquez, Esq.

(57) ABSTRACT

A semiconductor integrated circuit with memory redundancy circuit to address the problems of increased area, power consumption and access time which is caused by using an ECC circuit for error correction. The circuit includes: a plurality of memory mats; a local bus, parallel to word lines, which transfers read data and write data from memory cells; a global bus for writing, parallel to data lines, which transfers write data from an input pad IO; a global bus for reading, parallel to data lines, which transfers read data to an output pad IO; and at least one error correction circuit located at an intersection of the global buses and the local bus. Reading and writing may each be completed in a single cycle, and during a write operation, data which is different from data previously read is written. By this configuration, an increase in area and power consumption can be avoided and errors such as soft errors can be corrected.

7 Claims, 8 Drawing Sheets

U.S. PATENT DOCUMENTS

| | | |
|---|---|---|
| 5,151,906 A | 9/1992 | Sawada |
| 5,384,789 A | 1/1995 | Tomita |
| 5,546,410 A | 8/1996 | Ando et al. |
| 5,914,907 A | 6/1999 | Kobayashi et al. |
| 6,065,146 A | 5/2000 | Bosshart |
| 6,665,209 B2 | 12/2003 | Osada et al. |
| 6,677,649 B2 * | 1/2004 | Osada et al. ................ 257/379 |
| 2001/0038552 A1 * | 11/2001 | Ishimaru .................... 365/181 |
| 2002/0067637 A1 * | 6/2002 | Nii ............................ 365/156 |

FOREIGN PATENT DOCUMENTS

| | | |
|---|---|---|
| JP | 61-50295 | 8/1984 |
| JP | 61-261898 | 5/1985 |
| JP | 62-214599 | 3/1986 |
| JP | 7-45096 | 3/1993 |
| JP | 11-212877 | 1/1998 |

* cited by examiner

SEMICONDUCTOR MEMORY CELLS WITH SHARED P-TYPE WELL

CROSS-REFERENCES TO RELATED APPLICATIONS

This application is a Continuation of U.S. application Ser. No. 10/170,583 filed on Jun. 14, 2002 now U.S. Pat. No. 7,219,272. Priority is claimed based on U.S. application Ser. No. 10/170,583 filed on Jun. 14, 2002, which claims the priority date of Japanese Patent Application No. 2001-202919 filed on Jul. 4, 2001 and Japanese Patent Application No. 2002-016320 filed on Jan. 25, 2002, the entire disclosure of which is incorporated herein by reference.

BACKGROUND OF THE INVENTION

1. Field of the Invention

The present invention relates to a semiconductor memory device, and particularly to an SRAM (static random access memory) and an on-chip memory which is mounted on a system LSI.

2. Description of the Background

With the recent trend toward a decrease in the voltage applied to memory cells and a reduction in cell size, the problem of deterioration in soft error immunity has emerged. It is known that there are semiconductor integrated circuits which use an ECC (Error Correction Code) circuit to correct such data errors, as illustrated by JP-A-50295/1986 and JP-A-45096/1995. JPA-45096/1995 discloses a circuit technology which corrects a fail bit by adding a parity bit to normal data. JP-A-212877/1999 discloses a circuit technology which rewrites part of data which has the same parity bit.

However, in the method given by JP-A-45096/1995, all data in an array must be read in sequential order to correct an error at the time of reading and it is impossible to read, correct, and output data in a single cycle.

Also, in the method given by JP-A-212877/1999, data and a parity bit are read, part of the corrected data is replaced with written data, and a parity bit is regenerated. Only the regenerated parity bit and written data are rewritten, but the corrected bits cannot be rewritten.

SUMMARY OF THE INVENTION

At least one preferred embodiment of the present invention is directed to a semiconductor device which comprises a plurality of memory cells and an error correction circuit, wherein reading and writing are each completed in a single cycle. In this semiconductor device, memory cells on a word line which share a p-type well are allocated to different addresses. A latch type sense amplifier is provided on a memory mat such that a page mode or burst mode is supported according to data held by the latch type sense amplifier. In this way, the semiconductor device has a domino type error repair circuit. Further, in the writing operation, only data which is different from the data previously read is written.

According to another aspect of the present invention, a semiconductor device having a plurality of memory cells and an error correction circuit may comprise: a plurality of memory mats comprising memory cells; a local bus, parallel to word lines, which transfers read data and write data (data to be written) from the memory cells; a global bus for writing, parallel to data lines, which transfers write data from an input pad IO; a global bus for reading, parallel to data lines, which transfers read data to an output pad IO; and at least one error correction circuit located at an intersection of the global bus and local bus.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

First Exemplary Embodiment

Figure 1:
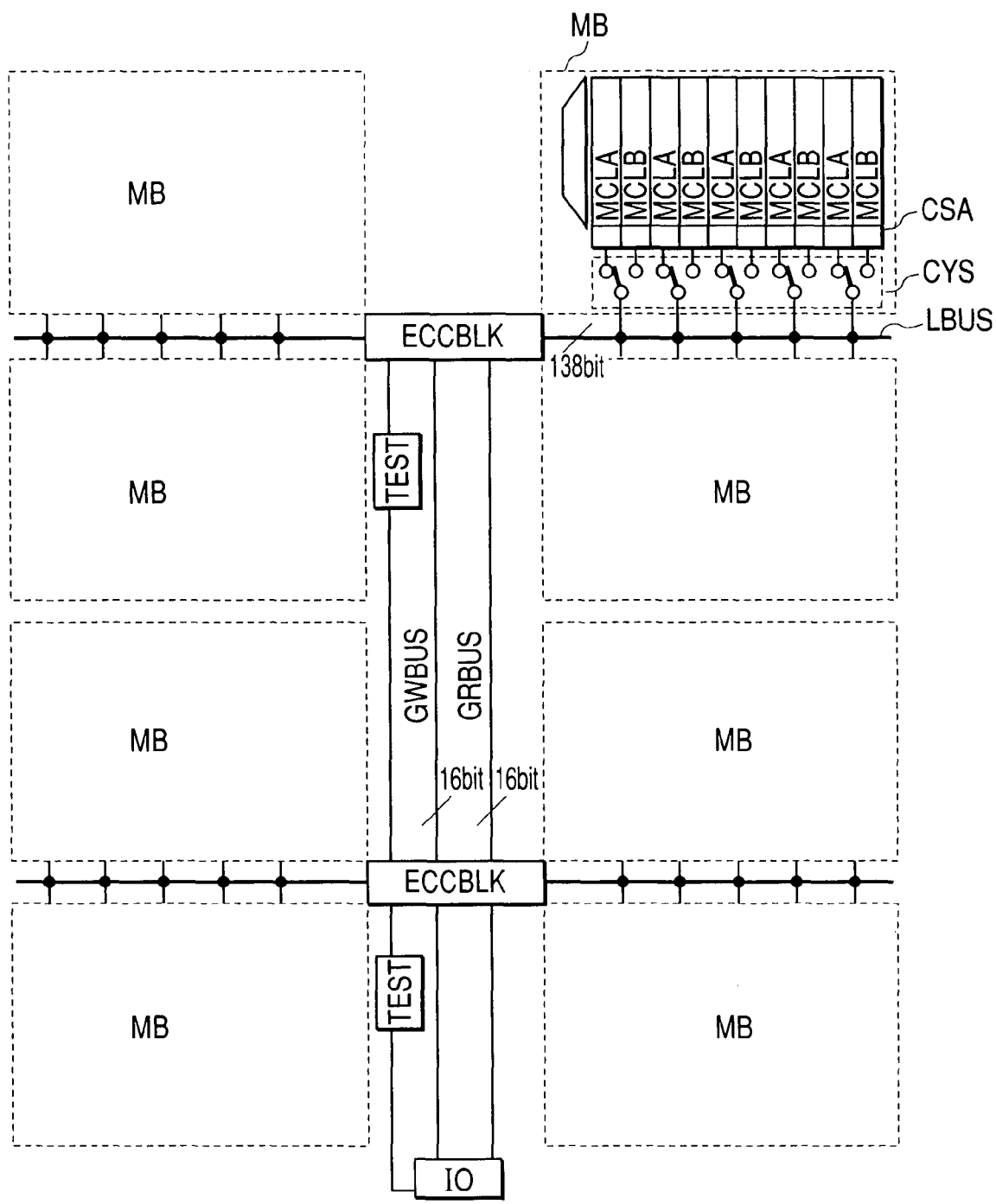
FIG. 1 is a circuit diagram showing a semiconductor integrated circuit according to a first exemplary embodiment of the present invention.

FIG. 1 is a circuit diagram illustrating an example of an application of the present invention to an SRAM. An SRAM memory with an ECC as a semiconductor memory device is divided into a plurality (eight, in this example) of memory blocks. Each block comprises a memory array, a latch type sense amplifier circuit CSA, and a Y switch circuit CYS. The memory array is comprised of memory columns A (MCLA) and memory columns B (MCLB). The memory columns A and B are allocated to different addresses. For example, assuming that there is one parity bit in every 10-bit address and adjacent memory cells on a word line are allocated to an address, if one of the neighboring memory cells, which share the allocated parity bit, has an error, the error cannot be repaired. On the other hand, if adjacent memory cells are allocated to different addresses, each having its own parity bit, then even if one of the adjacent memory cells has an error, the error can be repaired. Since a soft error is likely to occur in an adjacent memory cell, it is useful to allocate a different address to the adjacent column (bit).

In addition, the device may further include a common 138-bit wide local bus for reading and writing which is parallel to the word line and a 16-bit wide global bus for reading GRBUS and a 16-bit wide global bus for writing GWBUS which are both parallel to the data line. There is an error correction block (ECCBLK) at an intersection of the local bus and global buses.

For reading, data from either column A (MCLA) or column B (MCLB) is output to the local bus LBUS as 138 bits of data by a Y switch. 128 bits out of the 138 bits are normal data, and 10 bits are parity bits. Out of the 138-bit data, the error correction block corrects an error of 1 bit or less and outputs 128 bits of data. Only the required 16 bits are read according to the address and output to the global bus for reading GRBUS. The data thus read is held in the latch type sense amplifier circuit so that the 128-bit data output from the error correction block is also held. When an address to read another bit out of the 128-bit data from the error correction block is entered, high speed data output can be achieved by changing the selection for output of the error correction block without the need to access the memory array, and a page mode can be thus supported.

In the page mode, initially, the word line selected is fixed by a row address (the voltage of the word line is selected, namely "L" or "H"), the column address is changed, and the voltage is read to change the next column address to perform a reading operation. In this case, a word line is selected first and the reading of the data is half completed, so the word line selecting time is not needed, which permits high-speed data reading. According to the present invention, because the 128-bit output from the error correction block ECCBLK is maintained, with the world line selected, bit lines can be successively selected for reading, and thus, the page mode can be used. Under a similar method, it is possible to support a burst mode in which a column address (burst address) is automatically generated internally by a single read instruction, and data is successively read.

If a multi-bit error adjacent to a memory column A MCLA and a memory column B MCLB occurs on a word line, the memory column A and the memory column B are separately corrected; therefore, even when the error correction block ECCBLK can correct only 1 bit, this type of multi-bit failure can be corrected.

A test circuit TEST is preferably connected between the error correction block ECCBLK and the input/output pad IO. The TEST circuit disables the error correction circuit. When testing the operation of the memory blocks, a path which does not run through the error correction circuit is needed. This circuit uses NAND and NOR logic circuits to disable the error correction circuit so that reading from or writing to the memory cells can be performed with no mediation of the error correction circuit.

Figure 2:
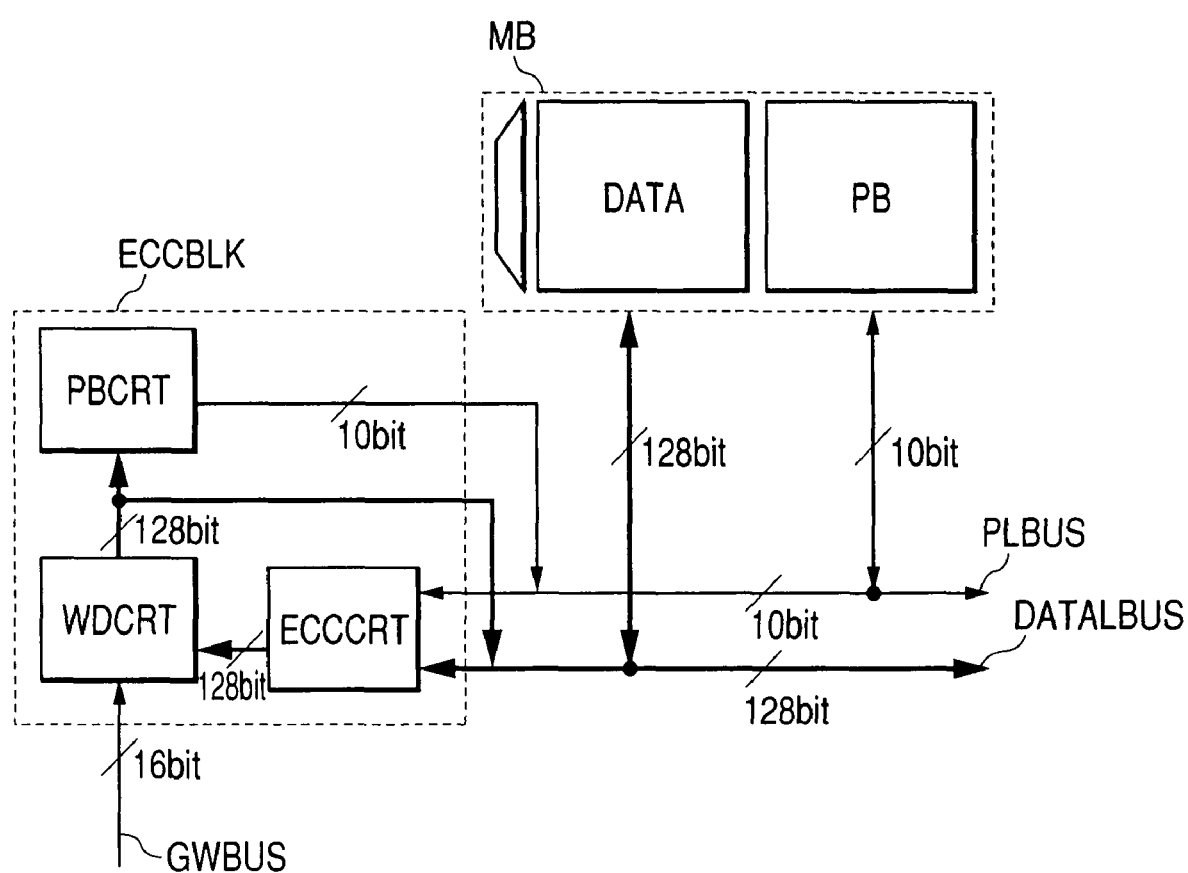
FIG. 2 is a circuit diagram showing a semiconductor integrated circuit according to the first exemplary embodiment of the present invention.

The writing operation sequence will be explained with reference to FIG. 2 which shows, in expanded form, part of what is shown in FIG. 1. As in the reading operation, 128 bits of normal data and 10 parity bits are read and output to the local bus LBUS, respectively. According to the data thus read, an error is corrected by the error correction circuit, and 128 bits of data are output. The write data generation circuit WDCRT replaces part of the 128-bit data with 16 bits of write data and outputs 128 bits. Based on these 128 bits, a parity bit generation circuit PBCRT generates 10 parity bits. The ten parity bits thus generated and the 128 bits of data are sent back to the local bus. However, since the data which has been previously read remains on the local bus, there is a transition in only those bus lines which correspond to the new or modified write data of 16 bits, 10 parity bits, and 1 correction bit.

For writing to the memory cells, the write amplifier is activated only when the data left in the latch type sense amplifier circuit which has been read is different from the data input to the local bus (16 bits of write data, 10 parity bits, and 1 correction bit).

Because of the above-mentioned configuration, power consumption in the writing operation may be reduced. Also, because the 138-bit local bus is used for both reading and writing, the bus region need not be extended to the edge of a chip, minimizing the increase in area.

Second Exemplary Embodiment

Figure 3:
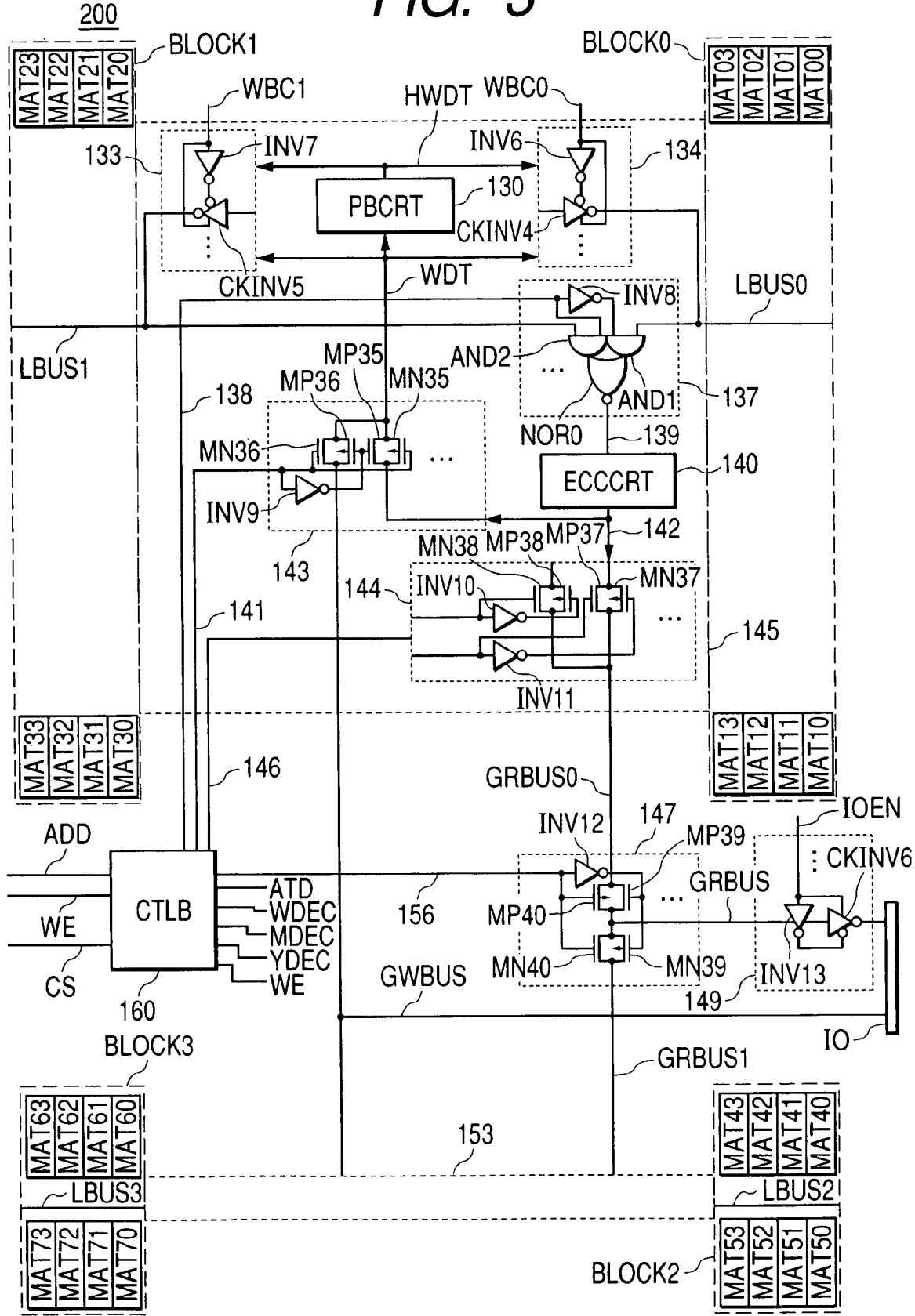
FIG. 3 is a circuit diagram showing a semiconductor integrated circuit according to a second exemplary embodiment of the present invention.
Figure 4:
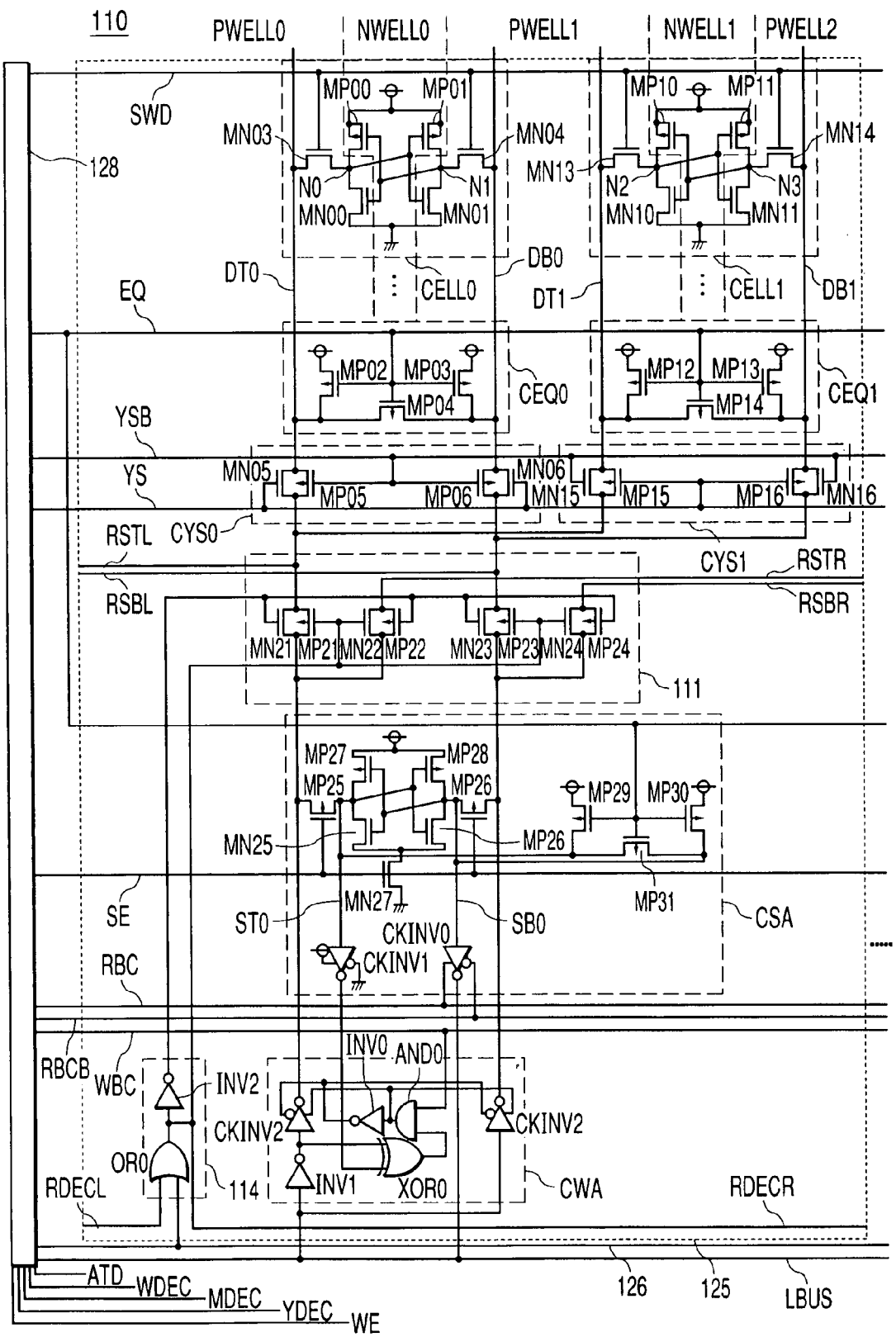
FIG. 4 is a circuit diagram showing a semiconductor integrated circuit according to the second exemplary embodiment of the present invention.

FIG. 3 is a circuit diagram illustrating an example of application of the present invention to an SRAM. This semiconductor memory device is formed on a semiconductor substrate made of a material such as single crystal silicon. An SRAM memory with ECC 200, as a semiconductor memory device, is divided into a plurality (32, in this example) of memory mats MAT. Each memory mat (MAT) comprises a circuit 110 as shown in FIG. 4. Eight memory mats comprise a single memory block (BLOCK); there is a local bus LBUS in the center of the block. In this embodiment, the bus width of the local bus LBUS is 138 bits. An error correction block 145 is provided at the point where the local buses (LBUS0, LBUS1) of two blocks (BLOCK0, BLOCK1) intersect.

Likewise, an error correction block 153 is provided at the point where the local buses (LBUS2, LBUS3) of two blocks (BLOCK2, BLOCK3) intersect. The error correction block 145 and the error correction block 153 are interconnected by a global bus for reading GRBUS and a global bus for writing GWBUS.

The error correction block 145 is comprised of the following circuits: an error correction circuit 140; a parity bit generation circuit 130; a 2:1 selection circuit 137 which selects either the local bus LBUS0 or LBUS1 according to selection signal 138 and transmits data to the error correction circuit 140; a selection circuit 144 which selects the corrected data 142 according to selection signal 146 and outputs it to the global bus for reading GRBUS0; a circuit 143 which generates write data WDT according to selection signal 141; and write data drive circuits (133, 134) which output the write data WDT to the local buses LBUS.

The 2:1 selection circuit 137 has a series of selection circuits each of which comprises AND circuits (AND1, AND2), a NOR circuit NOR0, and an inverter circuit INV8; it selects either of the local buses (LBUS0, LBUS1) according to the selection signal 138 for the output of data to a bus 139. In this embodiment, the error correction circuit 140 uses 128 bits of data and 10 parity bits to correct an error of 1 bit and outputs 128 bits of data to the bus 142. The selection circuit 144 has a series of selection circuits each of which consists of N-channel MOS transistors (MN37, MN38), P-channel MOS transistors (MP37, MP38), and inverter circuits (INV10, INV11); it selects 16 bits of data out of the data of 128 bits from the bus 142 according to selection signal 146 and outputs the bits to the global bus for reading GRBUS0.

The write data generation circuit 143 has a series of data selection circuits each of which consists of N-channel MOS transistors (MN35, MN36), P-channel MOS transistors (MP35, MP36), and an inverter circuit INV9; it replaces the 16-bit data on the global bus for writing GWBUS with 16 bits out of the 128 bits of data 142 which have been read and corrected, according to write data selection signal 141 and outputs the new data to the data bus WDT. The parity bit generation circuit 130 generates 10 parity bits for error correction from the write data of 128 bits WDT and outputs them to a parity bit bus for writing HWDT.

The write data drive circuit 134 for the output of write data to a local bus LBUS0 has a series of circuits each of which comprises a clocked inverter circuit CKINV4 and an inverter circuit INV6. The circuit 134 outputs write data WDT and parity bits HWDT for writing to the local bus LBUS0 according to write data control signal WBC0. The write data drive circuit 133 for the output of write data to a local bus LBUS1 has a series of circuits each of which comprises a clocked inverter circuit CKINV5 and an inverter circuit INV7. It outputs write data WDT and parity bits HWDT for writing to the local bus LBUS1 according to write data control signal WBC1.

A selection circuit 147, which connects the error correction circuit 145 through the global bus for reading GRBUS0, and the error correction circuit 153 through the global bus for reading GRBUS1, to the global bus for reading GRBUS according to selection signal 156, has a series of data selection circuits each of which comprises N-channel MOS transistors (MN39, MN40), P-channel MOS transistors (MP39, MP40), and an inverter circuit INV12. An I/O output circuit 149, which outputs the data on the global bus for reading GRBUS to the output pad IO according to IO enable signal IOEN, has a series of circuits each of which comprises a clocked inverter CKINV6 and an inverter INV13. A control block 160 generates the following signals from address signal ADD, chip selection signal CS, and write selection signal WE: word line decode signal for word line decoding WDEC; mat decode signal for mat decoding MDEC; and Y switch decode signal for column selection YDEC; write selection signal WE; various selection signals (138, 141, 146); and ATD pulse ATD.

Next, the MAT circuit 110 will be described with reference to FIG. 4. The mat (MAT) comprises an array block and a control circuit 128 where the array block has a plurality of base units (128 units for normal data, 10 units for parity bits, and 4 units for redundancy, in this embodiment).

A base unit 125 is comprised of two columns of memory cell array. Data lines (DT0, DB0) are connected with a plurality of memory cells. For examples a memory cell CELL0 is comprised of a flip-flop and N-channel MOS transistors (MN03, MN04), where the flip-flop has a pair of CMOS inverters whose inputs and outputs are interconnected (the flip-flop comprises P-channel MOS transistors (MP00, MP01) and N-channel transistors (MN00, MN01). The N-channel MOS transistors (MN03, MN04) connect the storage nodes N0 and N1 of the flip-flop to the data lines (DT0, DB0). The gate electrodes of the N-channel MOS transistors (MN03, MN04) are connected with word line SWD.

The P-channel MOS transistors (MP00, MP01) are formed on n-type well NWELL0, the N-channel transistors (MN00, MN03) are formed on p-type well PWELL0, and N-channel transistors (MN01, MN04) are formed on p-type well PWELL1. N-type wells and p-type wells are insulated from each other by LOCOS (Local Oxidation of Silicon) or trench isolation. P-type well PWELL0, n-type well NWELL0 and p-type well PWELL1 are arranged in the order of mention with LOCOS or trench isolation between wells in a manner that an n-type well is sandwiched between two p-type wells. The p-type and n-type wells are both semiconductor regions formed on a semiconductor substrate. Lack of these two p-type wells in the layout would mean that different types of conductive wells are not arranged in the direction of the word line, which may lead to easy propagation of soft errors. In contrast, when the present layout is employed, different types of conductive wells are arranged in the direction of the word line, and different types of wells are insulated from each other, reducing the chance of propagating soft errors.

Data lines (DT1, DB1) are connected with a plurality of memory cells. For example, a memory cell CELL1 is comprised of a flip-flop and N-channel MOS transistors (MN13, MN14), where the flip-flop has a pair of CMOS inverters whose inputs and outputs are interconnected (the flip-flop comprises P-channel MOS transistors (MP10, MP11) and N-channel transistors (MN10, MN11)), and the N-channel MOS transistors (MN13, MN14) connect the storage nodes N2 and N3 of the flip-flop to the data lines (DT1, DB1). The gate electrodes of the N-channel MOS transistors (MN13, MN14) are connected with sub-word line SWD. The P-channel MOS transistors (MP10, MP11) are formed on n-type well NWELL1, N-channel transistors (MN10, MN13) are formed on p-type well PWELL1, and N-channel transistors (MN11, MN14) are formed on p-type well PWELL2. P-type well PWELL1, ntype well NWELL1 and p-type well PWELL2 are arranged in the order of mention with LOCOS or trench isolation between wells in a manner that an n-type well is sandwiched between two p-type wells. The memory cells CELL0 and CELL1, which share PWELLs where the gates of transfer MOSs (MN03, MN04, MN13, MN14) are connected with the same word line, are pre-allocated to different addresses (parity bits).

The base unit 125 includes a sense amplifier circuit (CSA), a write amplifier circuit (CWA), equalizer precharge circuits (CEQ0, CEQ1) and Y switch circuits (CYS0, CYS1). It also includes a shift switch for redundancy 111 and a decoder circuit for redundancy 114. The sense amplifier circuit (CSA) is comprised of: a flip-flop consisting of P-channel MOS transistors (MP27, MP28) and N-channel MOS transistors (MN25, MN26); a latch type sense amplifier circuit consisting of an N-channel MOS transistor MN27 to activate the sense amplifier; and switch circuits (MP25 and MP26). The gate electrodes of the MOS transistors (MN27, MP25, MP26) are connected with sense amplifier control signal SE. In addition, P-channel MOS transistors (MP29, MP30, MP31) are provided in order to precharge the sense amplifier output signals (ST0, SB0). The gate electrodes of the P-channel MOS transistors (MP29, MP30, MP31) are connected with equalizer precharge circuit control signal EQ. A clocked inverter circuit CKINV0 outputs sense amplifier output SB0 to the local bus LBUS. The clocked inverter circuit CKINV0 is controlled by control signals (RBC, RBCB). A clocked inverter circuit CKINV1 inputs sense amplifier output ST0 into the write amplifier circuit CWA. The control signal for the clocked inverter circuit CKINV1 is fixed so as to keep the circuit active.

The Y switch circuit CYS0 is comprised of P-channel MOS transistors (MP05, MP06) and N-channel MOS transistors (MN05, MN06) which connect the data lines (DT0, DB0) and the sense amplifier circuit CSA, and it is controlled by control signals (YS, YSB). The Y switch circuit CYS1 is comprised of P-channel MOS transistors (MP15, MP16) and N-channel MOS transistors (MN15, MN16) which connect the data lines (DT1, DB1) and the sense amplifier circuit CSA, and it is controlled by control signals (YS, YSB).

The write amplifier circuit CWA is comprised of clocked inverter circuits (CKINV2, CKINV3), inverter circuits (INV0, INV1), an AND circuit AND0, and an exclusive OR circuit XOR0. According to control signal WBC, data is sent to the data lines (DT0, DB0) only when the signal on the local bus LBUS is not the same as the read data ST0.

The equalizer precharge circuit CEQ0 is comprised of: P-channel MOS transistor MP02 which connects power voltage VDD and data line DT0; P-channel MOS transistor MP03 which connects power voltage VDD and data line DB0; and P-channel MOS transistor MP04 which connects data lines DT0 and DB0. The gate electrodes of the P-channel MOS transistors (MP02, MP03, MP04) are connected with control signal EQ.

The equalizer precharge circuit CEQ1 is comprised of: P-channel MOS transistor MP12 which connects power voltage VDD and data line DT1; P-channel MOS transistor MP13 which connects power voltage VDD and data line DB1; and P-channel MOS transistor MP14 which connects data lines DT1 and DB1. The gate electrodes of the P-channel MOS transistors (MP12, MP13, MP14) are connected with control signal EQ.

The shift switch for redundancy 111 is comprised of N-channel MOS transistors (MN21, MN22, MN23, MN24) and P-channel MOS transistors (MP21, MP22, MP23, MP24). The decoder circuit for redundancy 114 is comprised of an inverter circuit INV2 and an OR circuit OR0.

During normal operation, N-channel MOS transistors (MN21, MN23) and P-channel MOS transistors (MP21, MP23) are ON, and N-channel MOS transistors (MN22, MN24) and P-channel MOS transistors (MP22, MP24) are OFF. Data on the data lines (DT0, DB0, DT1, DB1) is entered into the sense amplifier CSA. However, if there is an error in a memory cell of the basic unit 125, according to shift selection signal 126, the N-channel MOS transistors (MN21, MN23) and P-channel MOS transistors (MP21, MP23) turn OFF and the N-channel MOS transistors (MN22, MN24) and P-channel MOS transistors (MP22, MP24) turn ON so that the sense amplifier CSA is connected with the data line for the next, right-hand basic unit through redundancy shift signal lines (RSTR, RSBR). Also, redundancy shift enable signal RDECR becomes "H", and the basic unit on the right of the basic unit 125 shifts similarly.

If there is an error in a memory cell of the basic unit on the left of it, redundancy shift enable signal RDECL becomes High, and N-channel MOS transistors (MN21, MN23) and P-channel MOS transistors (MP21, MP23) turn OFF, and N-channel MOS transistors (MN22, MN24) and P-channel MOS transistors (MP22, MP24) turn ON. Data on the data lines (DT0, DB0, DT1, DB1) is connected to the next, left-hand sense amplifier through redundancy shift signal lines (RSTL, RSBL), and the sense amplifier CSA is connected to the data line for the next, right-hand basic unit through redundancy shift signal lines (RSTR, RSBR). Likewise, redundancy shift enable signal RDECR becomes High, and the basic unit on the right of the basic unit 125 shifts similarly. For reading 138-bit wide data, the above-mentioned shift type error repair circuit is more effective than the conventional method in which another mat is accessed.

Figure 5:
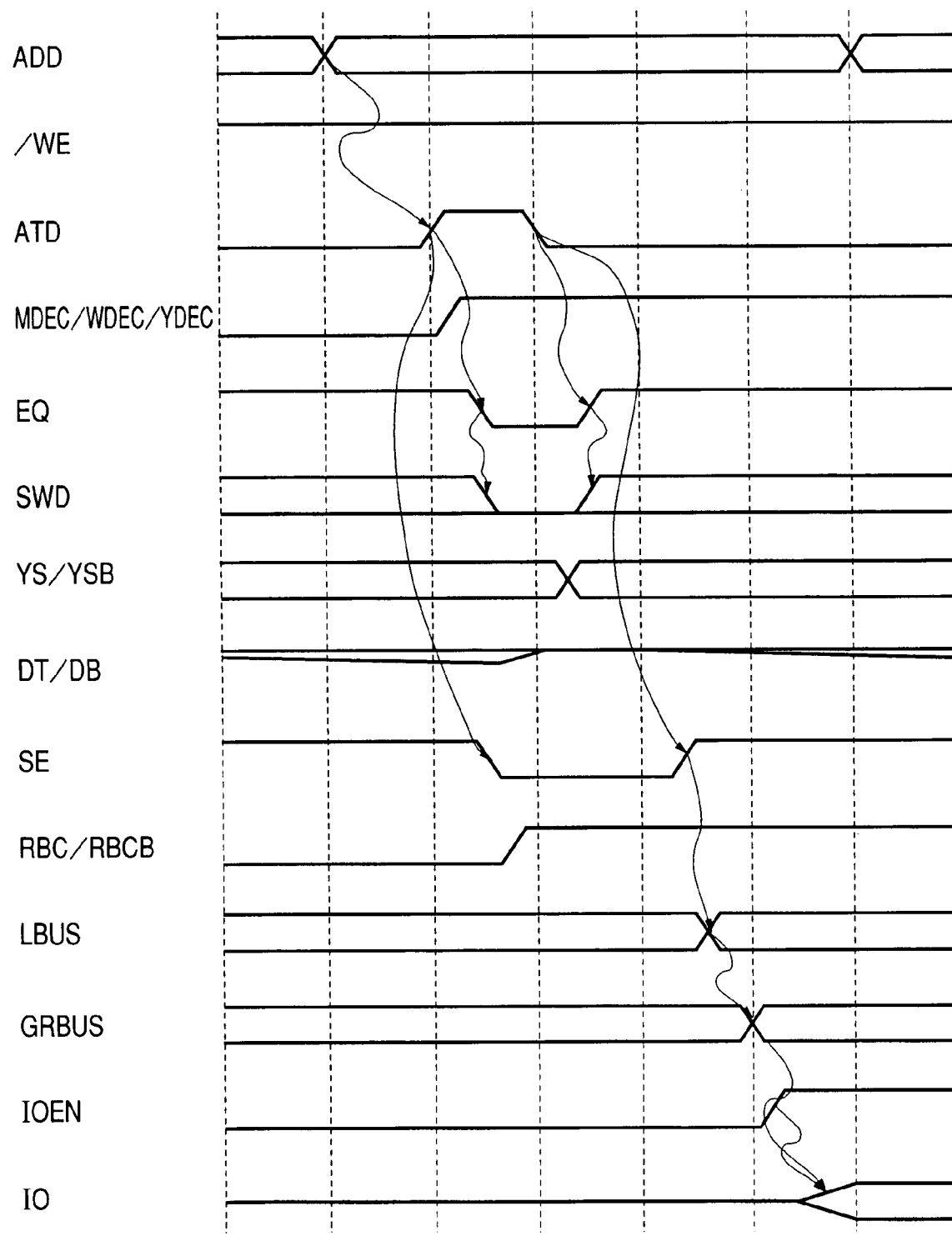
FIG. 5 shows waveforms for a reading operation in a semiconductor integrated circuit according to the second exemplary embodiment.

The reading operation sequence will be explained with reference to FIG. 5, a waveform diagram. When chip selection signal CS becomes "H" or a transition occurs in address ADD, an ATD pulse is generated, and a reading operation is started. The equalizer precharge control signal EQ of the mat (MAT) selected by mat decode signal MDEC becomes "L" and the data lines (DT, DB) are precharged/equalized. At this time, the word lines SWD are all OFF. After completion of precharge/equalization, according to word decode signal WDEC, the selected word line SWD turns ON, and a voltage difference arises on the data lines (DT, DB). Y switch control signals (YS, YSB) generated by Y switch decode signal YDEC connect either the data lines (DT0, DB0) or the data lines (DT1, DB1) with the sense amplifier circuit CSA. Thereafter, sense amplifier control signal SE is made "H" to activate the sense amplifier, and data is output to the local bus LBUS according to the read data control signals RBC, RBCB.

Data to be output to the local bus LBUS is 128 bits of normal data and 10 parity bits. The data output to the local bus LBUS passes through the selection circuit 137 and enters the error correction circuit 140 where the error is corrected before output of the 128-bit data to the data bus 142. Further, the selection circuit 145 selects data (16 bits) and outputs it to the read data global bus GRBUS0, and then the data passes through the selection circuit 147 and enters the I/O output circuit 149 from which it is output to the output pad IO according to I/O enable signal IOEN. Since the data held by the sense amplifier is continuously output to the data bus 142, if the address ADD is changed in the next cycle to output another set of 16 bits out of the 128 bits output, to the output pad I/O, data output can be done simply by changing the selection signal 146 without memory cell access, at higher speed than in the conventional access method.

The memory cells (CELL0, CELL1) share p-type well PWELL1. When alpha rays are incident on PWELL1, data reversal may occur in the memory cells CELL0 and CELL1 simultaneously. However, CELL0 and CELL1, which share the same p-type well, are pre-allocated to different addresses (parity bits) and are not accessed simultaneously, so a correction may be made even in the error correction circuit in which only 1 bit can be corrected. Also, p-type wells PWELL0 and PWELL1 are separated by n-type well NWELL0 so that alpha rays incident on PWELL1 do not affect PWELL0 and therefore also do not affect the data in the memory cell located on the left of the memory cell CELL0. This means that memory cells which do not share a p-type well are less likely to fail at the same time and can be simultaneously accessed for reading without difficulty. According to the present invention, a read operation may be accomplished in a single cycle. Here, one cycle refers to a period from an address change to a next address change. From another viewpoint, it may be considered as a period from word line SWD's first (last) transition to its last (first) transition.

Figure 6:
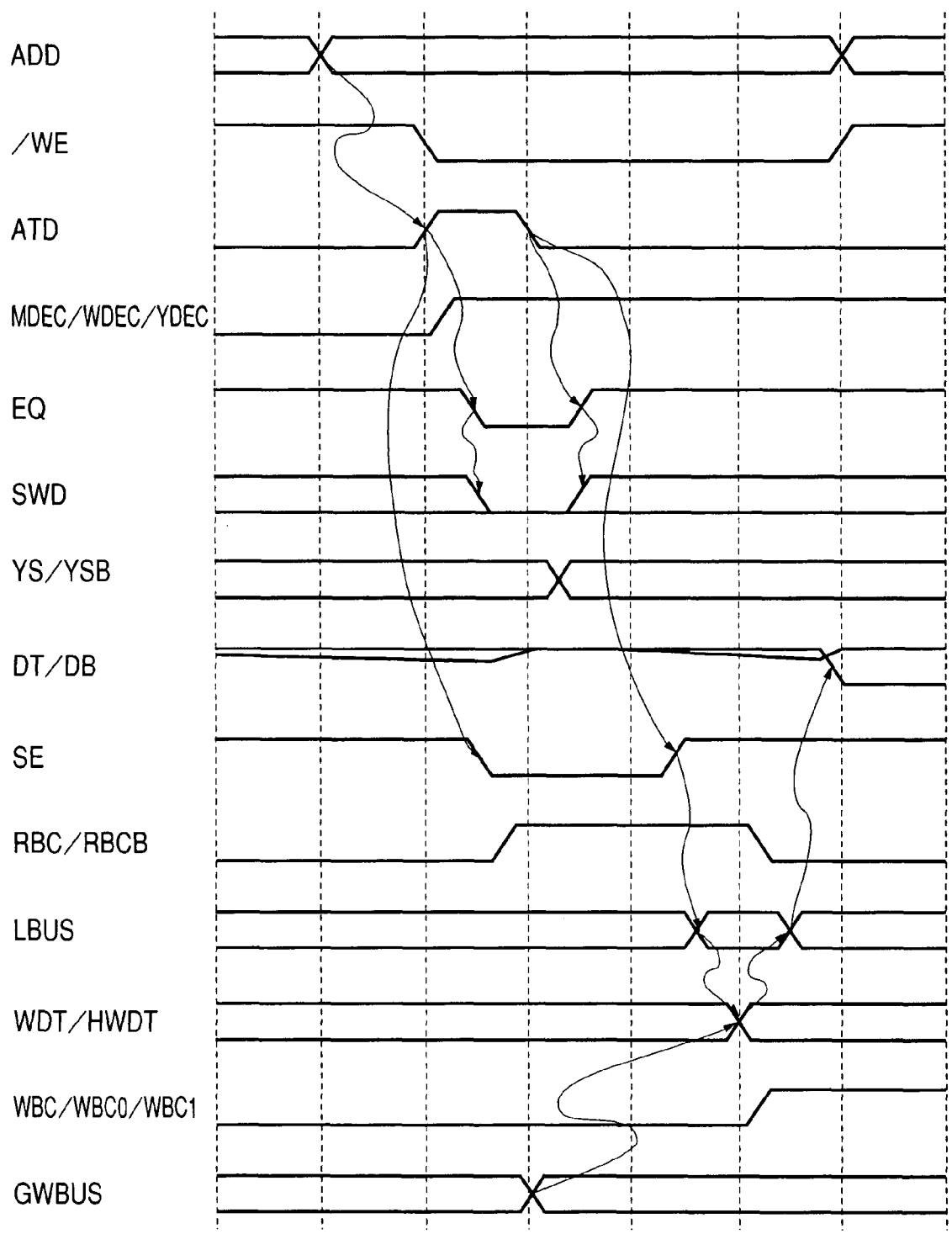
FIG. 6 shows waveforms for a writing operation in a semiconductor integrated circuit according to the second exemplary embodiment.

Next, the writing operation sequence will be explained with reference to FIG. 6, a waveform diagram. When chip selection signal CS becomes "H" or an address transition occurs, an ATD pulse is generated and a writing operation is started. The equalizer precharge control signal EQ of the mat (MAT) selected by mat decode signal MDEC becomes "L" and the data lines (DT, DB) are precharged/equalized. At this time, the word lines SWD are all OFF. After completion of precharge/equalization, according to word decode signal WDEC, the selected word line SWD turns ON and a voltage difference arises on the data lines (DT, DB). According to Y switch control signals (YS, YSB) generated by Y switch decode signal YDEC, either the data lines (DT0, DB0) or the data lines (DT1, DB1) are connected with the sense amplifier circuit CSA. Thereafter, sense amplifier control signal SE is made "H" to activate the sense amplifier, and data is output to the local bus LBUS according to read data control signals (RBC, RBCB).

Data to be output to the local bus LBUS is 128 bits of normal data and 10 parity bits. The data once output to the local bus LBUS passes through the selection circuit 137 and enters the error correction circuit 140. The corrected 128-bit data is output to the data bus 142, and the output data enters the write data generation circuit 143. Also, 16 bits of write data from the input pad IO passes through the global bus for writing GWBUS and enters the write data generation circuit 143. According to selection signal 141, part (16 bits) of the corrected data is replaced by the 16-bit data on the global bus for writing GWBUS, and the resulting data is output as write data WDT.

Write data WDT is 128 data bits. Ten parity bits are generated by the parity bit generation circuit 130. The generated parity bits HWDT and write data WDT are sent back to the local bus LBUS through the write data drive circuit 133 according to write data control signal WBC0. The data which has been read remains on the local bus so a change occurs only in the data on the local bus LBUS which corresponds to the data (16 bits of write data from the input pad IO, 10 parity bits, and a corrected 1 bit) which has changed.

The write amplifier circuit CWA is activated by write data control signal WBC, and the data which has been read is held in the latch type sense amplifier CSA. Only when there exists on the local bus LBUS any data which is different from the held read data (corresponding to 16 bits of write data from the input pad IO, 10 parity bits, and a corrected 1 bit), the data is entered to the data lines (DT, DB) and is written to the memory cell. When there is no change in data, no transition occurs in the local bus LBUS and data line, resulting in reduced power consumption. It is also acceptable to write into the memory cell all data which is sent back to the local bus LBUS. According to the present invention, a write operation may be accomplished in a single cycle. Here, one cycle refers to a period from an address change to a next address change. In other words, one cycle may be considered as the period from word line SWD's first (last) transition to its last (first) transition.

Third Exemplary Embodiment

Figure 7:
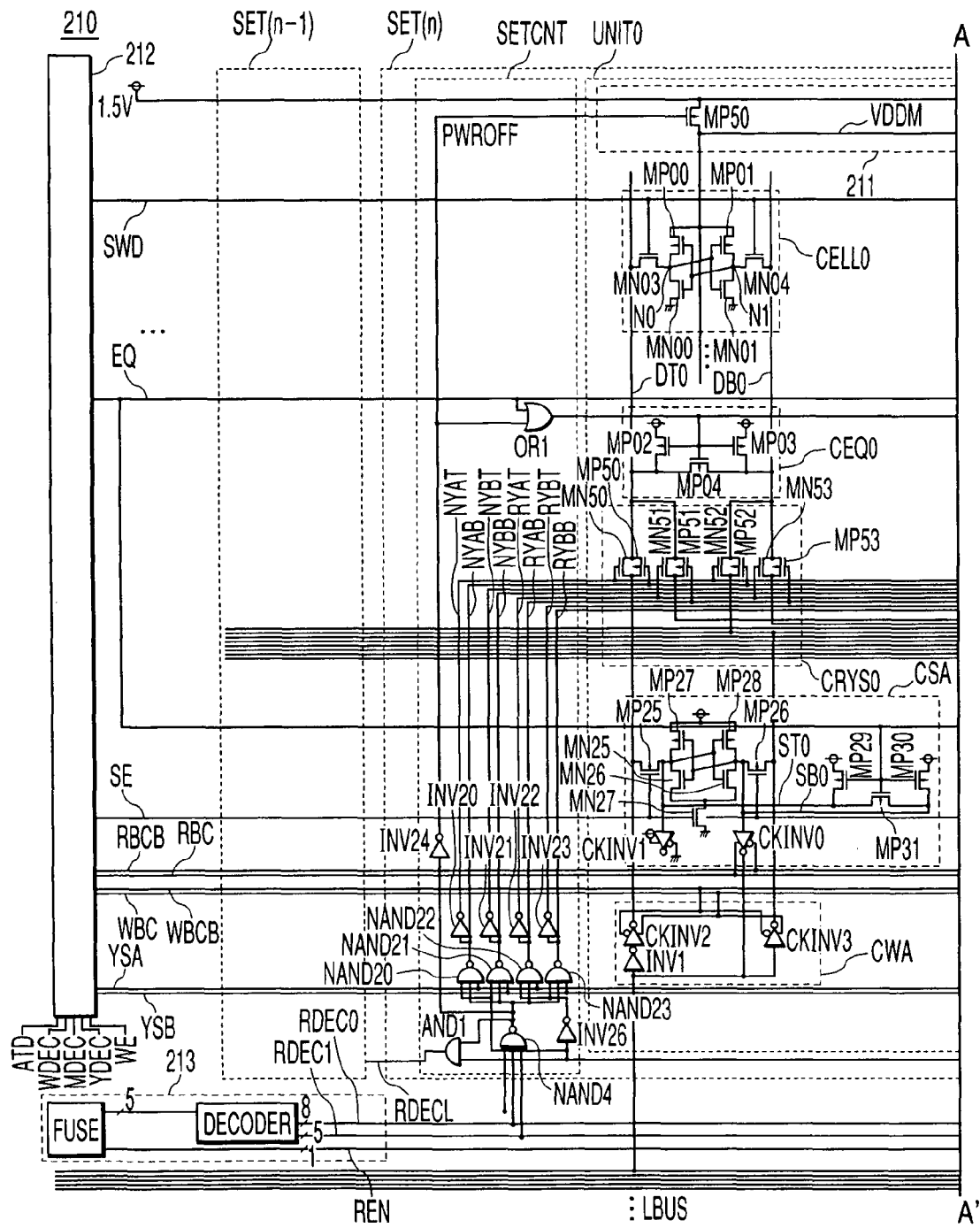
FIG. 7 is a circuit diagram showing a semiconductor integrated circuit according to a third exemplary embodiment of the present invention.
Figure 8:
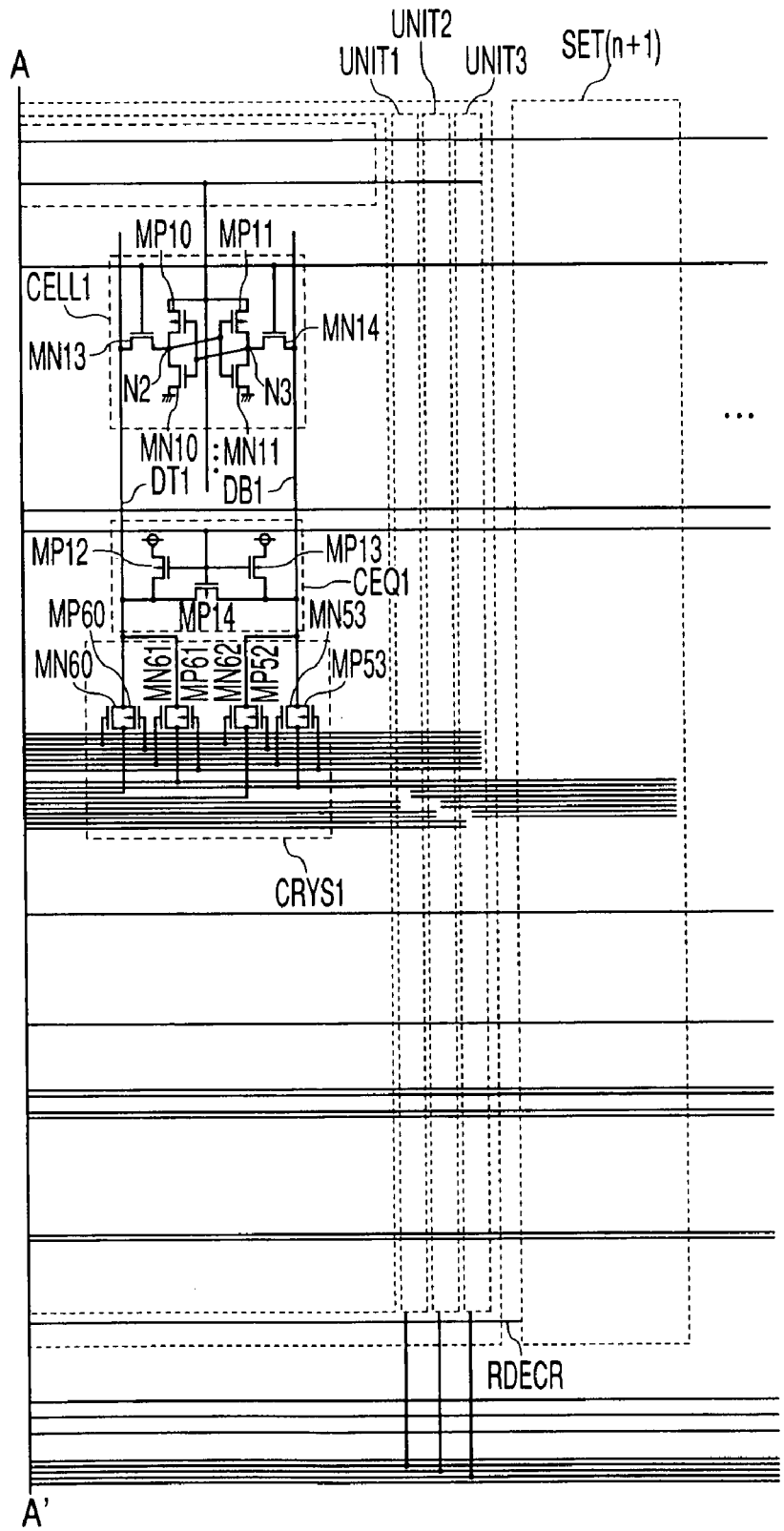
FIG. 8 is a circuit diagram showing a semiconductor integrated circuit according to the third exemplary embodiment of the present invention.

The memory mat MAT with a shift type error repair circuit as illustrated by the second exemplary embodiment may be replaced by a circuit 210 with a redundancy circuit for a current defect as shown in FIGS. 7 and 8. FIGS. 7 and 8 make up a diagram with line AA' as the boundary.

Referring to FIGS. 7 and 8, the mat circuit 210 will be explained next. The mat (MAT) is comprised of an array block as an arrangement of a plurality of base sets SET, a control circuit 212, and a decoder circuit 213 which specifies a redundancy set.

A base set SET is comprised of a plurality of units (four units in this embodiment, UNIT0, UNIT1, UNIT2, UNIT3) and a control circuit SETCNT. Each unit is comprised of a plurality of columns of memory cell array (two columns in this embodiment), a circuit 211 for supplying voltage to the memory cell, equalizer precharge circuits (CEQ0, CEQ1), column switches (CRYS0, CRYS1), a sense amplifier CSA, and a write amplifier CWA. Data lines (DT0, DB0) are connected with a plurality of memory cells. For example, a memory cell CELL0 is comprised of a flip-flop and N-channel MOS transistors (MN03, MN04), where the flip-flop has a pair of CMOS inverters whose inputs and outputs are interconnected (the flip-flop comprises P-channel MOS transistors (MP00, MP01) and N-channel transistors (MN00, MN01)), and the N-channel MOS transistors (MN03, MN04) connect the storage nodes N0 and N1 of the flip-flop to the data lines (DT0, DB0). The gate electrodes of the N-channel MOS transistors (MN03, MN04) are connected with word line SWD.

Data lines (DT1, DB1) are connected with a plurality of memory cells. For example, a memory cell CELL1 is comprised of a flip-flop and N-channel MOS transistors (MN13, MN14), where the flip-flop has a pair of CMOS inverters whose inputs and outputs are interconnected (the flip-flop comprises P-channel MOS transistors (MP10, MP11) and N-channel transistors (MN10, MN11)), and the N-channel MOS transistors (MN13, MN14) connect the storage nodes N2 and N3 of the flip-flop to the data lines (DT1, DB1). The gate electrodes of the N-channel MOS transistors (MN13, MN14) are connected with sub-word line SWD.

The sense amplifier circuit (CSA) includes a flip-flop comprised of P-channel MOS transistors (MP27, MP28) and N-channel MOS transistors (MN25, MN26), a latch type sense amplifier circuit consisting of an N-channel MOS transistor MN27 to control activation of the sense amplifier, and switch circuits (MP25 and MP26). The gate electrodes of the MOS transistors (MN27, MP25, MP26) are connected with sense amplifier control signal SE. In addition, P-channel MOS transistors (MP29, MP30, MP31) are provided in order to precharge the output signals (ST0, SB0) of the sense amplifier. The gate electrodes of the P-channel MOS transistors (MP29, MP30, MP31) are connected with equalizer precharge circuit control signal EQ. A clocked inverter circuit CKINV0 outputs the value of sense amplifier output SB0 to the local bus LBUS. The clocked inverter circuit CKINV0 is controlled by control signals (RBC, RBCB). A clocked inverter circuit CKINV1 is connected with the sense amplifier output ST0. The control signal for the clocked inverter circuit CKINV1 is fixed so as to keep the circuit active.

The column switch circuit CRYS0 is comprised of a normal switch and a redundancy switch. Here, the normal switch comprises P-channel MOS transistors (MP50, MP52) and N-channel MOS transistors (MN50, MN52) which connect the data lines (DT0, DB0) and the sense amplifier circuit CSA, and it is controlled by control signals (NYAT, NYAB). The redundancy switch comprises P-channel MOS transistors (MP51, MP53) and N-channel MOS transistors (MN51, MN53) which connect the data lines (DT0, DB0) and the sense amplifier circuit CSA in the next set (SET (n+1)), and it is controlled by control signals (RYAT, RYAB). In other words, although the first data line pair (DT, DB) and second data line pair (DT, DB) in two sets SET (n, n+1) are connected with the first and the second sense amplifier (CSA), respectively, the column switch circuit (CRYS) selects either the output of the first data line pair or the output of the second data line pair which is then entered into the first sense amplifier. The output of the first data line pair is selected when there is no defect in the preceding set (n−1) or the present set (n) with respect to the shift direction. On the other hand, the output of the second data line pair is selected when there is a defect in the preceding set (n−1) or the current set (n) with respect to the shift direction.

The column switch circuit CRYS1 is comprised of a normal switch and a redundancy switch. Here, the normal switch comprises P-channel MOS transistors (MP60, MP62) and N-channel MOS transistors (MN60, MN62) which connect the data lines (DT1, DB1) and the sense amplifier circuit CSA, and it is controlled by control signals (NYBT, NYBB). The redundancy switch comprises P-channel MOS transistors (MP61, MP63) and N-channel MOS transistors (MN61, MN63) which connect the data lines (DT1, DB1) and the sense amplifier circuit CSA in the next set (SET (n+1)), and it is controlled by control signals (RYBT, RYBB).

The write amplifier circuit CWA is comprised of clocked inverter circuits (CKINV2, CKINV3) and an inverter circuit (INV1). According to control signal WBC, data is sent to data lines (DT0, DB0) or data lines (DT1, DB1). The equalizer precharge circuit CEQ0 is comprised of: P-channel MOS transistor MP02 which connects power voltage VDD and data line DT0; P-channel MOS transistor MP03 which connects power voltage VDD and data line DB0; and P-channel MOS transistor MP04 which connects data lines DT0 and DB0. The gate electrodes of the P-channel MOS transistors (MP02, MP03, MP04) are connected with control signal EQ. The equalizer precharge circuit CEQ1 is comprised of: P-channel MOS transistor MP12 which connects power voltage VDD and data line DT1; P-channel MOS transistor MP13 which connects power voltage VDD and data line DB1; and P-channel MOS transistor MP14 which connects data lines DT1 and DB1. The gate electrodes of the P-channel MOS transistors (MP12, MP13, MP14) are connected with control signal EQ.

The circuit for supplying a voltage to the memory cell 211 comprises P-channel MOS transistor MP50 which connects power voltage VDD and memory cell power line VDDM. The gate electrode of the P-channel MOS transistor MP50 is connected with signal PWROFF which controls voltage supply to the memory cell. In this embodiment, the circuit for supplying a voltage to the memory cell 211 is connected between the high voltage side power voltage VDD and the power line VDDM on the source side of P-channel MOS transistors (MP00, MP01, MP10, MP11) in the memory cell. Alternatively, it may also be connected between the low voltage side power voltage (ground potential) and the power line on the source side of the drive N-channel MOS transistors (MN00, MN01, MN10, MN11) in the memory cell. In that case, the circuit for supplying voltage to the memory cell comprises an N-channel MOS transistor and receives output of NAND gate NAND4 as it is while inverter INV24 is no longer needed.

It is also possible to provide a circuit for supplying a voltage to the memory cell on both the high voltage side and low voltage side in order to ensure that current leakage is prevented, though an increase in area is unavoidable. For the purpose of reducing power consumption within the memory cell, if a switch comprising a MOS transistor with a source-drain channel is provided between the memory cell operating voltage supply line and the power line to keep the memory cell off during the standby (non selection) period, a circuit for supplying voltage to the memory cell should be provided between the voltage supply line and the power line having no such switch where a conductive MOS transistor unlike the MOS transistor constituting the switch should be used.

For the sake of area efficiency, a switch designed to turn off during the standby period often comprises an N-channel MOS transistor having a source-drain channel between the low voltage side power voltage (ground potential) and the drive MOS transistor in the memory cell. Therefore, as a result of locating a circuit for supplying voltage to the memory cell between the low voltage side power voltage and the drive MOS transistor in the memory cell, two MOS transistors would be inserted in series, which might cause a slowdown in memory cell operation. This embodiment is advantageous in that this problem is avoided by locating a circuit for supplying voltage to the memory cell between the high voltage side and the load MOS transistor in the memory cell.

The control circuit SETCNT is comprised of the following circuits: a NAND circuit NAND4 which decodes decode signals (RDEC0, RDEC1, REN) from the decoder circuit 213 for specifying a redundancy set; a circuit AND1 which carries out the logical AND between the output of NAND4 and the signal RDECR indicating a shift of SET (n+1) and generates signal RDECL to notify SET (n−1) of the shift; an inverter circuit INV24 which generates signal for current defect repair PWROFF by reversing the output of NAND4; a circuit INV26 which reverses signal RDECR; an OR circuit OR1 which stops equalization during current defect repair; and circuits (NAND20, NAND21, NAND22, NAND23, INV20, INV21, INV22, INV23) which control column switch circuits (CRYS0, CRYS1) according to repair information and Y selection signals (YSA, YSB).

The control circuit 212 generates control signals (SWD, EQ, SE, RBC, RBCB, WBC, WBCB, YSA, YSB) according to basic clock ATD, mat decode signal MDEC, word line decode signal WDEC, Y switch decode signal YDEC, and write selection signal WE.

The decoder circuit 213 which specifies a redundancy set uses a decoder circuit (DECODER) to decode according to the signal from fuse (FUSE) to generate signals (RDEC0, RDEC1, REN). For example, if there is a defect (e.g., a physical defect) in the memory cell of SET (n), the output of NAND circuit NAND4 becomes low (L), all MOS transistors of the column switch circuits (CRYS0, CRYS1) in SET (n) turnoff, all MOS transistors of the equalizer precharge circuits (CEQ0, CEQ1) turn off, and the P-channel MOS transistor (MP50) for supplying voltage to the memory cell turns off as well. As a consequence, no voltage is supplied to the memory cell in SET (n) and current leakage due to a defect ceases.

Also, because the column switch is off, access is impossible. The sense amplifier CSA and write amplifier CWA in SET (n) are connected with the memory cell in SET (n−1) as redundancy shift enable signal RDECR becomes low. The sense amplifier CSA and write amplifier CWA in SET (n−1) are connected with the memory cell in SET (n−2). In this way, sets on the left of SET (n−1) shift similarly.

The reading and writing operation sequences are preferably the same as in the second exemplary embodiment.

According to the present invention, errors such as soft errors and hardware defects may be corrected without the need for an increase in area and without causing more power to be consumed.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor device, comprising:
   a word line;
   a plurality of data line pairs across the word line;
   a plurality of P-type wells and a plurality of N-type wells, the P-type wells and the N-type wells being alternately formed in a direction in which the word line extends;
   a plurality of SRAM memory cells each connected with the word line and a corresponding one of the plurality data line pairs, and each having a plurality of MOS transistors which are formed in two of the plurality of P-type wells and one of the plurality of N-type wells, each of the plurality of the P-type wells being shared with two adjacent memory cells among the plurality of SRAM memory cells;
   a Y switch circuit connected with the plurality of data line pairs;

an error correction circuit receiving data selected by the Y switch circuit, wherein the adjacent two memory cells among the plurality of SRAM memory cells are selected by the Y switch circuit at a time different from each other and data read out from the adjacent two memory cells among the plurality of SRAM memory cells are inputted to the error correction circuit at a time different from each other.

2. A semiconductor device according to claim 1, further comprising:

a plurality of local data lines connected with the error correction circuit to transfer data selected by the Y switch circuit, wherein a number of the plurality of local data lines is smaller than that of the plurality of data line pairs.

3. A semiconductor device according to claim 2, further comprising:

a plurality of sense amplifiers connected between the Y switch circuit and the local data lines, wherein a number of the plurality of sense amplifiers is smaller than that of the plurality of data line pairs.

4. A semiconductor device according to claim 2, further comprising:

a plurality of global data lines connected to the error correction circuit to output data to outside of the semiconductor device, wherein a number of the plurality of global data lines is smaller than that of the plurality of local data lines.

5. A semiconductor device according to claim 4, wherein the plurality of global data lines are extended in a direction in which the plurality of data line pairs are extended.

6. A semiconductor device according to claim 5, wherein the plurality of local data lines are extended in a direction in which the word line are extended.

7. A semiconductor device according to claim 2, wherein the plurality of local data lines are extended in a direction in which the word line are extended.

* * * * *